United States Patent
Lattimore et al.

Patent Number: 5,812,418
Date of Patent: Sep. 22, 1998

[54] CACHE SUB-ARRAY METHOD AND APPARATUS FOR USE IN MICROPROCESSOR INTEGRATED CIRCUITS

[75] Inventors: George McNeil Lattimore; Robert Paul Masleid; John Stephen Muhich, all of Austin, Tex.

[73] Assignee: International Business Machines Corporation, Armonk, N.Y.

[21] Appl. No.: 742,221

[22] Filed: Oct. 31, 1996

[51] Int. Cl.⁶ .................................................. G06F 17/50
[52] U.S. Cl. ................................. 364/491; 711/3
[58] Field of Search .................. 364/488, 489, 364/490, 491; 711/3, 170

[56] References Cited

U.S. PATENT DOCUMENTS

| | | | |
|---|---|---|---|
| 5,253,203 | 10/1993 | Partovi et al. | 365/189.02 |
| 5,276,832 | 1/1994 | Holman, Jr. | 395/425 |
| 5,446,856 | 8/1995 | Baber | 395/401 |
| 5,498,990 | 3/1996 | Leung et al. | 327/323 |
| 5,509,132 | 4/1996 | Matsuda et al. | 395/403 |
| 5,636,125 | 6/1997 | Rostoker et al. | 364/468.28 |
| 5,752,260 | 5/1998 | Liu | 711/129 |

*Primary Examiner*—Vincent N. Trans
*Assistant Examiner*—Leigh Marie Garbowski
*Attorney, Agent, or Firm*—Anthony V. S. England; Kermit D. Lopez; Andrew J. Dillon

[57] ABSTRACT

A cache sub-array method and apparatus for use in microprocessor integrated circuits. A processor unit is disposed within a central region of the microprocessor integrated circuit; a peripheral region is designated as a cache memory array region and surrounds the central region; a predetermined number of cache memory sub-arrays are placed in the peripheral region such that variable size cache memory arrays may be efficiently created. The cache memory sub-arrays contain a fixed fraction of a total cache word. The microprocessor integrated circuit itself has a modular cache memory array of variable size, and includes a central region having a processor unit disposed therein, a peripheral region designated as a cache memory array region surrounding the central region, and a predetermined number of cache memory sub-arrays disposed in the peripheral region such that the cache memory sub-arrays compose a modular cache memory array of variable size.

6 Claims, 4 Drawing Sheets

CACHE SUB-ARRAY METHOD AND APPARATUS FOR USE IN MICROPROCESSOR INTEGRATED CIRCUITS

BACKGROUND OF THE INVENTION

1. Technical Field

The invention relates in general to integrated circuit technology and more particularly to the design of semiconductor memories. In particular, the invention relates to the layout of arrays of high-speed, high-density cache memory cells on semiconductor substrates. Still more particularly, the invention relates to efficient integrated circuit chip designs, having variable memory cache sizes for microprocessor integrated circuits.

2. Description of the Related Art

Computer systems generally have several different storage layers defining a memory hierarchy. These layers typically include registers in a central processor unit, main system memory, and mass storage, such as disks. The performance of these different levels is quite different; the process registers are much faster than system memory, which in turn is significantly faster than access to mass storage.

In order to improve system performance, the cache, consisting of a small, fast memory, is used between the central processor and system memory. The cache takes advantage of the locality of reference phenomenon within computer programs to store data which is likely to be reused into fast memory.

Layout of microprocessor memory chips in a space-efficient manner is a goal sought by designers of integrated circuits. In the design of integrated circuits, particularly microprocessors, it is highly desirable to maintain a cache memory as close to the core of a microprocessor as possible so as to reduce processing time between the microprocessor and the cache memory.

A memory cache is a special memory subsystem in which frequently used data values are duplicated for quick access. A memory cache stores the contents of frequently accessed RAM locations and the addresses where these data items are stored. When the processor references an address in memory, the memory cache checks to see whether it holds that address. If it does hold the address, the data is returned to the processor; if it does not, a regular memory access occurs. A memory cache is useful when RAM accesses are slow compared with the microprocessor speed because cache memory is always faster than main RAM memory.

Advances in semiconductor processing techniques and improved memory cell designs have permitted semiconductor RAM chips to be manufactured with an ever-increasing memory capacity in excess of one million bits. The traditional construction of such a memory is a square array of rows and columns of memory cells. To address a bit of information, a row address is first transmitted to the memory chip along with a row address strobe signal. The row address is decoded to assert a signal on a "word line" extending across a selected row of memory cells. In response, each cell in the row asserts a stored information signal on a respective bit line extending along the cell's column in the array. During this time, a column address indicating an addressed bit line is transmitted to the memory chip along with a read or write signal. For a read operation, the information signal is read from the addressed bit line and asserted on an input/output line. For a write operation, an information signal from the input/output line is asserted on the addressed bit line and is written into the addressed memory cell.

Traditional memory array design practice for microprocessor memory caches calls for a rectilinear grid arrangement of sub-arrays. Such sub-arrays are often mirrored but rarely rotated. FIG. 1 depicts a rectilinear grid arrangement for a memory chip. The rectilinear grid 10 has sub-arrays 12 arranged on opposite regions of rectilinear grid 10.

Orientation markers 14 designate the orientation of each sub-array 12.

A semi-shared support circuit region 16 separates groups of sub-arrays 12 from one another. Occasionally, microprocessors have their memory caches subdivided into two to four sections to relieve the difficulty of incorporating a single large object into a chip floorplan. FIG. 2 depicts a microprocessor floorplan 20 having a region 22 dedicated to a microprocessor core and a region 24 dedicated to memory caches. Region 24 is subdivided into two sections.

Although commonly utilized in industry, rectilinear arrangements such as those depicted in FIG. 1 and FIG. 2 are not space-efficient and result in slower memory functions. In FIG. 2, for example, the memory cache, although located near the microprocessor, is divided into two memory cache sections only. In order to maintain a rectilinear arrangement, which is currently standard practice, there exist few choices for microprocessor design space in FIG. 2. Although the memory cache may be divided into smaller regions, the microprocessor core itself remains constant, limiting the number of possible memory cache arrangements while still maintaining a rectilinear cache design. Given a fixed microprocessor floor plan and a rectilinear arrangement for a cache design, a large variation in cache size is difficult to achieve. In FIG. 2, three principal memory cache arrangements are possible. The design depicted in FIG. 2 can be maintained; the two memory caches can be positioned parallel to one another with the microprocessor core positioned to one side; or the memory caches can be positioned opposite one another with the microprocessor core between.

To double the size of the memory cache, maintain a rectilinear array arrangement, and maintain a reasonably square chip would lead to the disruption of the microprocessor core space. At the very least, to add or delete memory cache in the rectilinear arrangement of FIG. 2 would make it necessary to modify the microprocessor core itself, which is an expensive and time consuming proposition. The challenge designers face is to derive a microprocessor floorplan which allows for a much wider variety of memory cache arrangements. The rectilinear arrangements utilized to date have not overcome this challenge.

SUMMARY OF THE INVENTION

It is therefore an object of the invention to provide for an integrated circuit technology.

It is another object of the invention to provide a design for semiconductor memories.

It is still another object of the invention to provide for the layout of arrays of high-speed, high-density cache memory cells on semiconductor substrates.

It is yet another object of the invention to provide efficient integrated circuit chip designs having variable memory cache array offerings.

The above and other objects are achieved as is now described. A cache sub-array method and apparatus for use in microprocessor integrated circuits is discussed. A processor unit is disposed within a central region of the microprocessor integrated circuit; a peripheral region is designated as a cache memory array region and surrounds the central region; a predetermined number of cache memory sub-arrays are placed in the peripheral region such that variable size cache memory arrays may be efficiently created. The cache memory sub-arrays each contain a fixed fraction of a total cache word. The microprocessor integrated circuit itself has a modular cache memory array of variable size, and includes a central region having a processor unit disposed therein, a peripheral region designated as a cache memory array region surrounding the central region, and a predetermined number of cache memory sub-arrays disposed in the peripheral region such that the cache memory sub-arrays compose a modular cache memory array of variable size.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
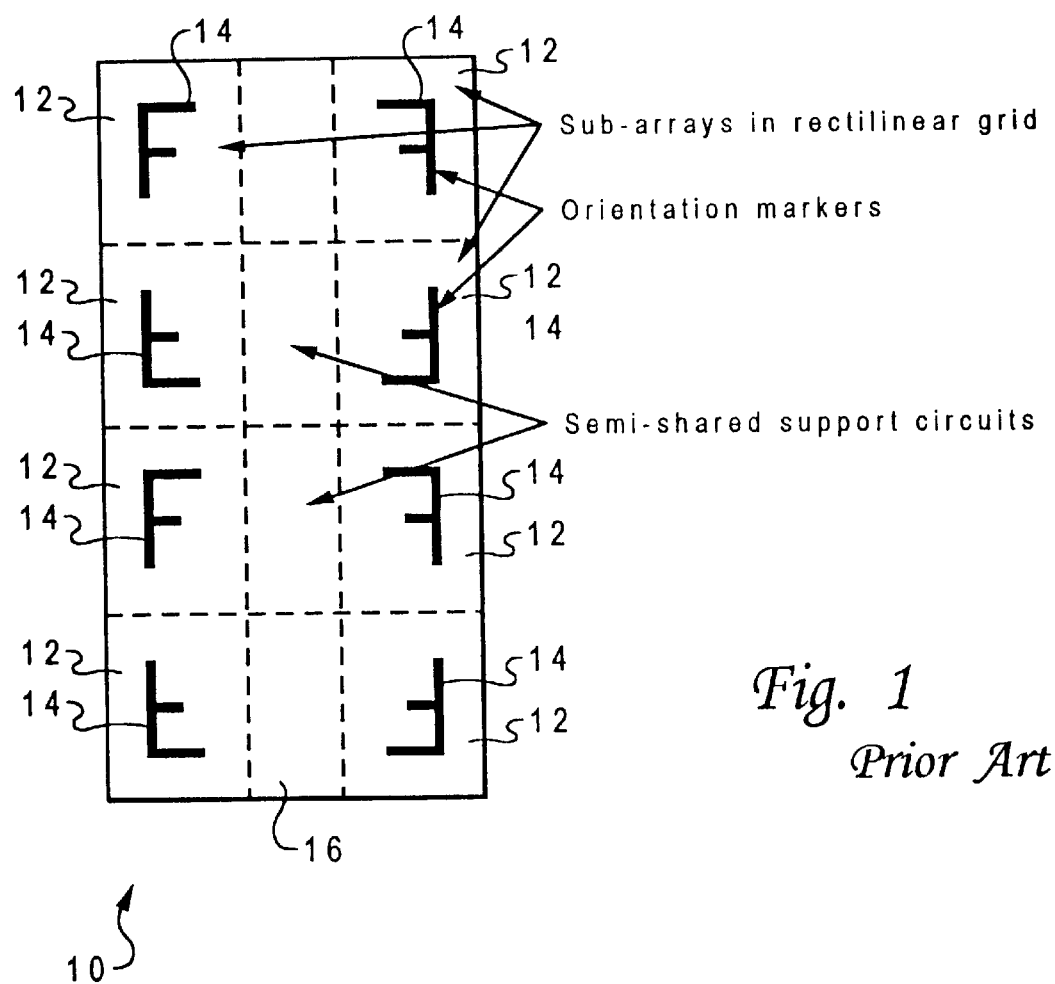
FIG. 1 depicts a prior art rectilinear grid arrangement of sub-arrays.
Figure 2:
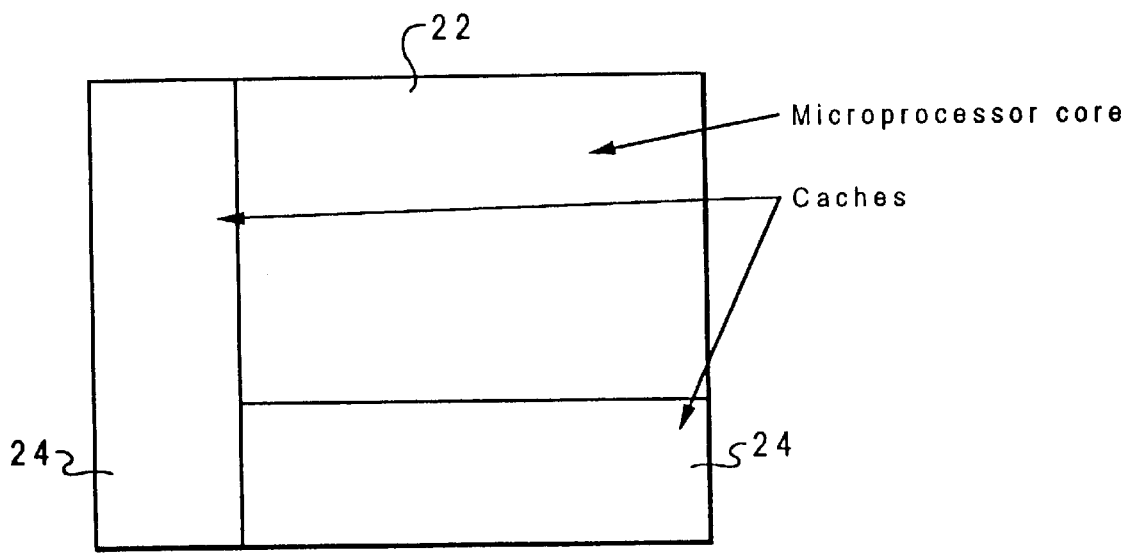
FIG. 2 depicts a prior art microprocessor floorplan.
Figure 3:
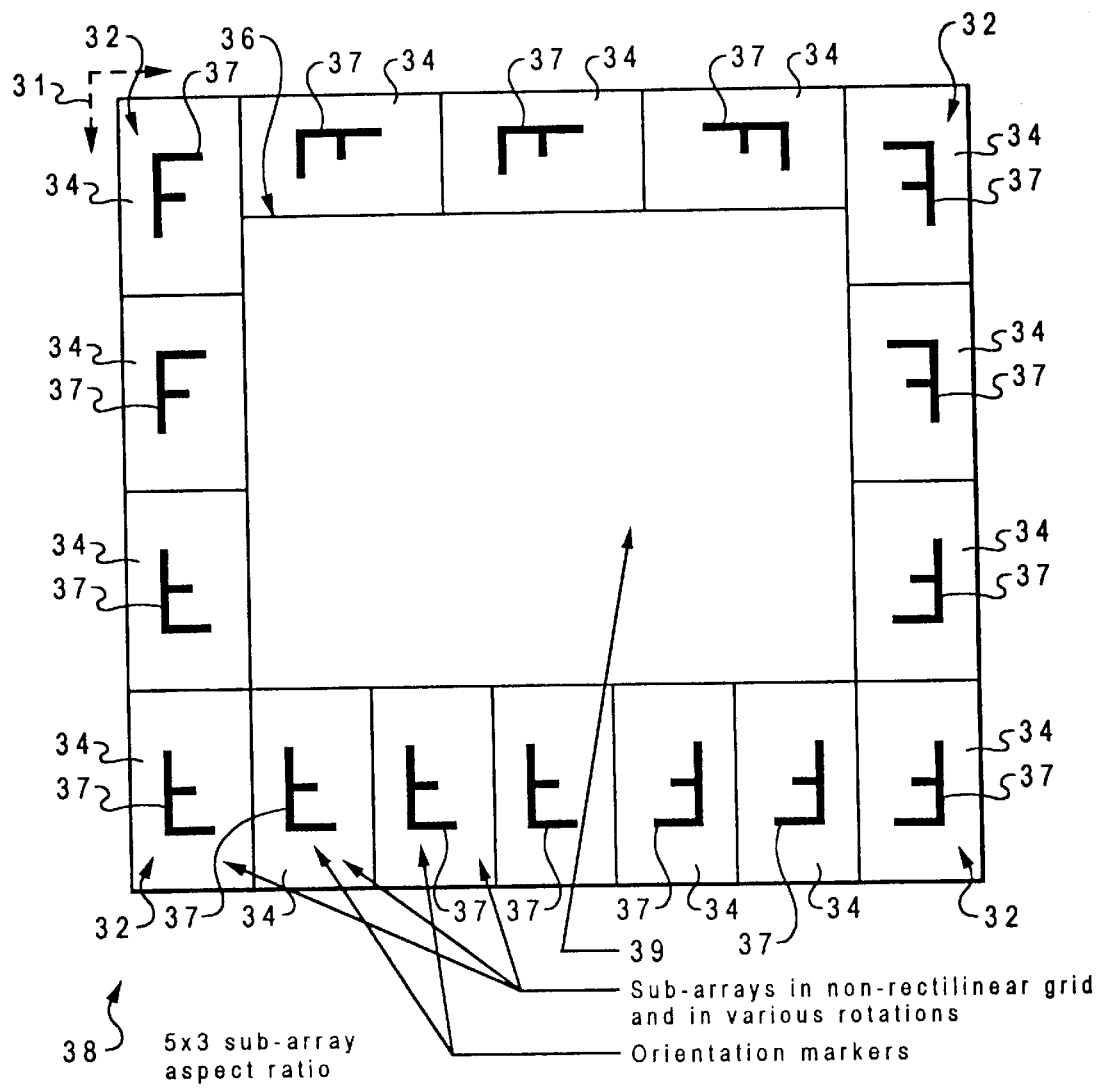
FIG. 3 depicts a first floorplan of a microprocessor including a memory cache having sub-arrays located about the perimeter of a microprocessor core.

With reference now to the figures and in particular with reference to FIG. 3, a floorplan 30 of a microprocessor which may be utilized in accordance with the present invention is depicted.

A cache 32 is organized into numerous sub-arrays 34. Cache 32 as depicted in FIG. 3 is a large on-board microprocessor cache (i.e. the cache is actually located "on board" the microprocessor). Cache 32 is a special, high-speed memory, that together with a main memory (not shown) dynamically allocates parts of the cache to addresses deemed most likely to be addressed soon. Cache 32 can contain redundant copies of the address space, which can be wholly contained in the main memory. Cache 32 is associative, or content-addressable, which is to say, the address of a memory location is stored, along with its content. Rather than reading data directly from a memory location, the cache is given an address and responds by providing data which may or may not be that requested. Cache 32 indicates that it is providing the correct data indicating a hit. Otherwise it indicates a miss. On a miss, the memory access is then performed with respect to the backing storage, and the cache is updated to include the new data. Cache 32 is intended to hold the most active portions of the memory, and the hardware dynamically selects portions of main memory to store in cache 32. When cache 32 is full, bringing in new data is matched by deleting old data. A microprocessor core 39 is centrally located within floorplan 30. The electronic "machinery" (i.e. the integrated microprocessor chip) will be located at microprocessor core 39. Cache 32 is essentially a collection of sub-arrays 34 which are simple memory arrays.

The number of sub-arrays 34 in FIG. 3 are typically 8, 16 or 32. The sub-arrays 34 are located on the perimeter 36 of a microprocessor core 39. Sub-arrays 34 preferably have a bit-slice logical organization.

Addressing is globally distributed but each sub-array 34 contains only a fraction of the total cache word. Sub-arrays 34 are logically and physically identical. They are fully self-contained (i.e. decode, multiplexors, and sense-amp circuits). Sub-arrays 34 are located, in a variety of mirrors and rotations and without a rectilinear grid arrangement, around the circumference of microprocessor core 39 to form the actual perimeter 31 of a chip. Default metal directions can be reversed over sub-arrays 34. Orientation markers 37 indicate the orientation of sub-arrays 34. The floorplan 30 of FIG. 3 is formed generally in the shape of a square, which is substantially different from the rectilinear arrangements commonly designed in the electronic integrated circuit industry.

Depending on the granularity and number of sub-arrays 34, a wide range of cache size design offerings can be accommodated with only modest disruption to the microprocessor core floorplan. For example, the size of the cache can be doubled without the necessity of modifying the microprocessor core by doubling the number of possible sub-arrays and rearranging them. Because the design is not limited to a rectilinear arrangements, a wide variety of memory cache arrangements is available for design space.

Figure 4:
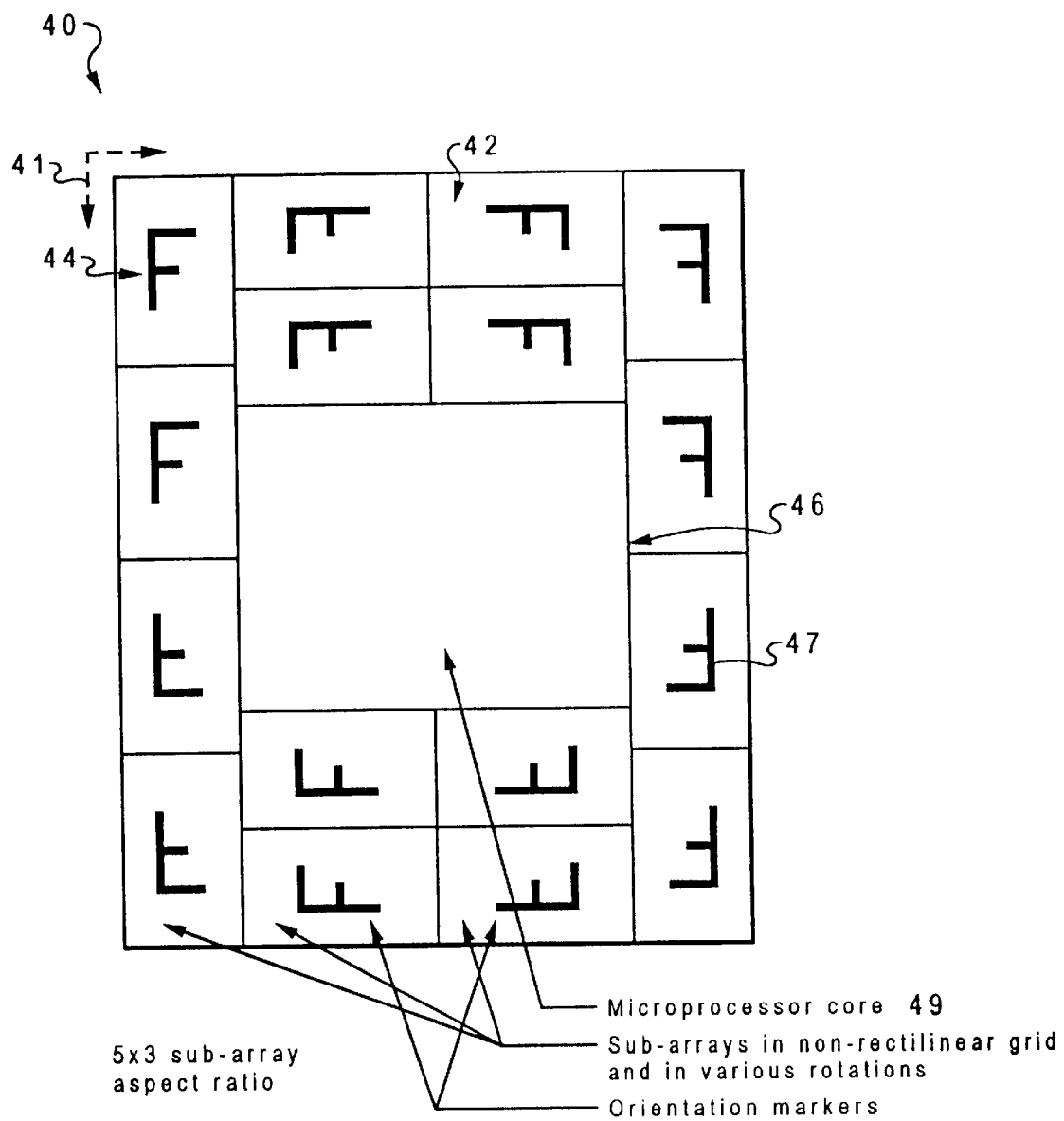
FIG. 4 depicts a second floorplan of a microprocessor including a memory cache having sub-arrays located about the perimeter of the same microprocessor core as in FIG. 3.

A variation on the arrangement of FIG. 3 is depicted in FIG. 4. FIG. 4 depicts a second floorplan of a microprocessor including a memory cache having sub-arrays located about the perimeter of the same microprocessor core as in FIG. 3. A floorplan 40 of a microprocessor is shown in FIG. 4. (The number of possible tiling permutations is especially rich when sub-arrays 44 are numerous and have aspect ratios in the range of approximately 2:3 to 3:4.) In FIG. 4, a large on-board microprocessor cache 42 is organized into numerous sub-arrays 44. Sub-arrays 44 are located on the perimeter 46 of a microprocessor core 49. Sub-arrays 44 have a bit-slice logical organization. Addressing is globally distributed but each sub-array 44 contains only a fraction of the total cache word. Sub-arrays 44 are logically and physically identical. They are also fully self-contained. Sub-arrays 44 are located, in a variety of mirrors and rotations and without a rectilinear grid arrangement, around the circumference of microprocessor core 49 to form the actual perimeter 41 of a chip. Default metal directions can be reversed over sub-arrays 44. Orientation markers 47 indicate the orientation of sub-arrays 44.

The tiling flexibility of sub-arrays 34 of FIG. 3 and sub-arrays 44 of FIG. 4 also accommodates variation in the microprocessor core area and form factor. FIG. 3 and FIG. 4 are drawn to the same scale, and have the same count and size of sub-arrays, yet the arrangement of FIG. 3 accommodates a microprocessor core area 2.25 times larger that of FIG. 4. All sub-arrays have the same switching activity, providing a dependable source of decoupling capacitance to the power chip distribution. The source is in close proximity to the microprocessor core and linked to the microprocessor core with numerous parallel paths.

While the invention has been particularly shown described with reference to a preferred embodiment, it will be understood by those skilled in the art that various changes in form and detail may be made therein without departing from the spirit and scope of the invention.

What is claimed is:

1. A method for the layout of a microprocessor integrated circuit, comprising the steps of:
   disposing a processor unit within a central region of said microprocessor integrated circuit; and
   designating a peripheral region surrounding said central region as a cache memory array region;
   placing a predetermined number of cache memory sub-arrays in said peripheral region such that variable size cache memory arrays may be efficiently created.

2. The method of claim 1 further comprising the step of modifying said cache memory sub-arrays to contain a fixed fraction of a total cache word.

3. The method of claim 2 further comprising the step of modifying said processor unit to include a microprocessor core.

4. A microprocessor integrated circuit having a modular cache memory array of variable cent, comprising:
   a central region having a processor unit disposed therein;
   a peripheral region surrounding said central region designated as a cache memory array region; and
   a predetermined number of cache memory sub-arrays disposed in said peripheral region such wherein said cache memory sub-arrays comprise a modular cache memory array of variable size.

5. The microprocessor integrated circuit of claim 4 wherein said processor unit comprises a microprocessor core.

6. The microprocessor integrated circuit of claim 5 wherein said cache memory sub-arrays contain a fixed fraction of a total cache word.

* * * * *